United States Patent
Huo

(10) Patent No.: US 10,498,062 B2
(45) Date of Patent: Dec. 3, 2019

(54) ELECTRICAL CONNECTOR

(71) Applicant: SHENZHEN DEREN ELECTRONIC CO., LTD., Shenzhen (CN)

(72) Inventor: Zhudong Huo, Shenzhen (CN)

(73) Assignee: SHENZHEN DEREN ELECTRONIC CO., LTD., Shenzhen (CN)

( * ) Notice: Subject to any disclaimer, the term of this patent is extended or adjusted under 35 U.S.C. 154(b) by 0 days.

(21) Appl. No.: 16/053,898

(22) Filed: Aug. 3, 2018

(65) Prior Publication Data

US 2019/0214759 A1 Jul. 11, 2019

(30) Foreign Application Priority Data

Jan. 5, 2018 (CN) .................. 2018 2 0021289 U
Jan. 5, 2018 (CN) .................. 2018 2 0021805 U

(51) Int. Cl.
| | |
|---|---|
| *H01R 13/11* | (2006.01) |
| *H01R 13/24* | (2006.01) |
| *H05K 7/10* | (2006.01) |
| *H01R 12/71* | (2011.01) |
| *H01R 12/57* | (2011.01) |
| *H01R 12/70* | (2011.01) |

(52) U.S. Cl.
CPC ............ *H01R 13/11* (2013.01); *H01R 12/57* (2013.01); *H01R 12/7082* (2013.01); *H01R 12/716* (2013.01); *H01R 13/24* (2013.01); *H05K 7/1069* (2013.01); *H01R 12/714* (2013.01)

(58) Field of Classification Search
CPC .... H01R 13/11; H01R 12/57; H01R 12/7082; H01R 12/716; H01R 13/24; H01R 12/714; H01R 12/52; H05K 7/1069
USPC ........................................ 439/816, 65, 66, 74
See application file for complete search history.

(56) References Cited

U.S. PATENT DOCUMENTS

| | | | | |
|---|---|---|---|---|
| 6,976,888 | B2 * | 12/2005 | Shirai | H01R 13/2442 439/733.1 |
| 7,578,675 | B2 * | 8/2009 | Polnyl | H01R 12/57 439/66 |
| 8,323,038 | B2 * | 12/2012 | Jin | H01R 12/714 439/66 |
| 8,454,373 | B2 * | 6/2013 | Cheng | H01R 12/57 439/66 |
| 9,350,091 | B2 * | 5/2016 | Huang | H01R 12/52 |
| 2013/0237066 | A1 * | 9/2013 | Yeh | H01R 13/2457 439/65 |

(Continued)

*Primary Examiner* — Travis S Chambers
(74) *Attorney, Agent, or Firm* — IPro, PLLC

(57) ABSTRACT

An electrical connector includes an insulating body and conductive terminals. The insulating body defines receiving holes, each of the receiving holes receiving a respective one of the conductive terminals. Each receiving hole includes a first hole portion, a second hole portion and a third hole portion. Each conductive terminal includes a main body, an elastic arm, and a connection portion. The main body is received in the second hole portion, the first hole portion and the third hole portion are respectively positioned on two opposite sides of the main body, and the elastic arm is at least partially positioned above the first hole portion. The insulating body includes a support portion located on a side of the main body, and the support portion and the third hole portion are located on the same side of the main body.

19 Claims, 16 Drawing Sheets

(56) References Cited

U.S. PATENT DOCUMENTS

2015/0171540 A1* 6/2015 Huang .................. H01R 12/52
                                                          439/722

* cited by examiner

US 10,498,062 B2

ELECTRICAL CONNECTOR

CROSS-REFERENCE TO RELATED APPLICATIONS

The present disclosure claims priority to Chinese Patent Application No. 201820021805.8 filed with the Chinese Patent Office on Jan. 5, 2018, titled "ELECTRICAL CONNECTOR", and also claims priority to Chinese Patent Application No. 201820021289.9 filed with the Chinese Patent Office on Jan. 5, 2018, titled "ELECTRICAL CONNECTOR", the entire contents of which are incorporated herein by reference.

TECHNICAL FIELD

The present disclosure relates to the field of connectors, and particularly, to an electrical connector for electrically connecting a chip module to a printed circuit board.

BACKGROUND

The planar grid array electrical connectors are widely used in the electronic field for electrically connecting a chip module to a printed circuit board to realize the signal and data transmission between the chip module and the circuit board. The electrical connectors include an insulating body and a plurality of conductive terminals received in the insulating body. When the electrical connectors enable the chip module to connect to the circuit board, the contact part of the conductive terminal is pressed on the conducting strip of the chip module, and the soldering part of the conductive terminal is soldered to the conducting strip of the circuit board through a solder, to transmit signals between the chip module and the circuit board.

With the upgrading of the functions of the electronic products, the integration level of the electronic devices becomes higher and higher, and the layout of the electrical connectors is increasingly concentrated. Therefore, the conductive terminals of the electrical connectors become smaller and smaller, which greatly weakens the strength of the conductive terminals, and further reduces the elasticity of the conductive terminals. To avoid the deformation of the conductive terminals in the process of being installed into the receiving holes of the insulation body, the size of the receiving holes must be larger than the size of the conductive terminals.

SUMMARY

An embodiment of this disclosure provides an electrical connector including: an insulating body and a plurality of conductive terminals received in the insulating body, the insulating body defining a plurality of receiving holes, each of the receiving holes receiving a respective one of the conductive terminals, each of the conductive terminals including a main body, an elastic arm, a connection portion and a welding portion, the elastic arm obliquely extending from an upper end of the main body, the connection portion extending from a lower end of the main body, the welding portion connected to the connection portion; wherein each of the receiving holes has a plurality of inner side faces, and includes a first hole portion, a second hole portion and a third hole portion, the first hole portion and the third hole portion being both in communication with the second hole portion; the main body is received in the second hole portion, the first hole portion and the third hole portion are respectively positioned on two opposite sides of the main body, and the elastic arm is at least partially positioned above the first hole portion; and the insulating body includes a support portion located on a side of the main body to support the main body, and the support portion and the third hole portion are located on the same side of the main body.

Another embodiment of this disclosure provides an electrical connector including: an insulating body and a plurality of conductive terminals received in the insulating body, the insulating body defining a plurality of securing holes, each of the securing holes receiving a respective one of the conductive terminals, each of the conductive terminals including a main body, an elastic arm, a connection portion and a holding portion, the elastic arm obliquely extending from an upper end of the main body, the connection portion extending from a lower end of the main body, the holding portion extending from a side of the main body; wherein the main body is obliquely arranged relative to an X axis of the insulating body, and the holding portion is parallel to a X axis or Y axis of the insulating body.

BRIEF DESCRIPTION OF THE DRAWINGS

One or more embodiments are illustrated by way of example, and not by limitation, in the figures of the accompanying drawings, wherein components having the same reference numeral designations represent like components throughout. The drawings are not to scale, unless otherwise disclosed.

DETAILED DESCRIPTION

For better understanding of the present disclosure, the present disclosure is described in detail with reference to attached drawings and specific embodiments. It should be noted that, when an element is defined as "being secured or fixed to" another element, the element may be directly positioned on the element or one or more centered elements may be present therebetween. When an element is defined as "being connected or coupled to" another element, the element may be directly connected or coupled to the element or one or more centered elements may be present therebetween. As used herein, the terms "vertical", "horizontal", "left", "right", and similar expressions are for illustration purposes.

Unless the specification clearly requires otherwise, throughout the description and the claims, the technical and scientific terms, such as "comprise", "comprising", "include", "including" and the like are to be construed in an inclusive sense as opposed to an exclusive or exhaustive sense; that is to say, in the sense of "including, but not limited to". Words using the singular or plural number also include the plural or singular number respectively. Additionally, the terms used in the specification of the present disclosure are merely for description the embodiments of the present disclosure, but are not intended to limit the present disclosure.

Figure 1:
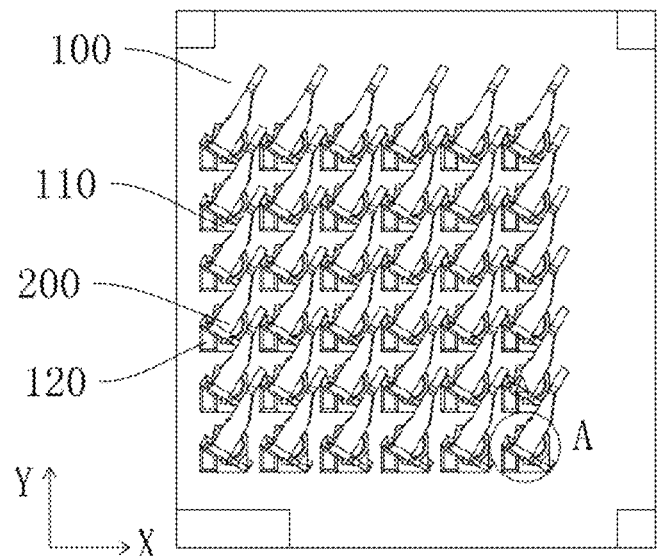
FIG. 1 is a top view of an electrical connector according to a first embodiment of the present disclosure.

An embodiment of the present disclosure provides an electrical connector, configured to electrically connect a chip module (not illustrated in the drawings) to a printed circuit board (not illustrated in the drawings). Referring to FIG. 1, the electrical connector includes an insulating body 100 and a plurality of conductive terminals received in the insulating body 100. The insulating body 100 includes a plurality of receiving holes 110. The plurality of receiving holes 110 are arranged in the form of grid in the insulating body 100. In this embodiment, the plurality of receiving holes 110 are parallelly arranged along an X axis or Y axis of the insulating body 100, and one receiving hole 110 receives one conductive terminal 200.

Figure 2:
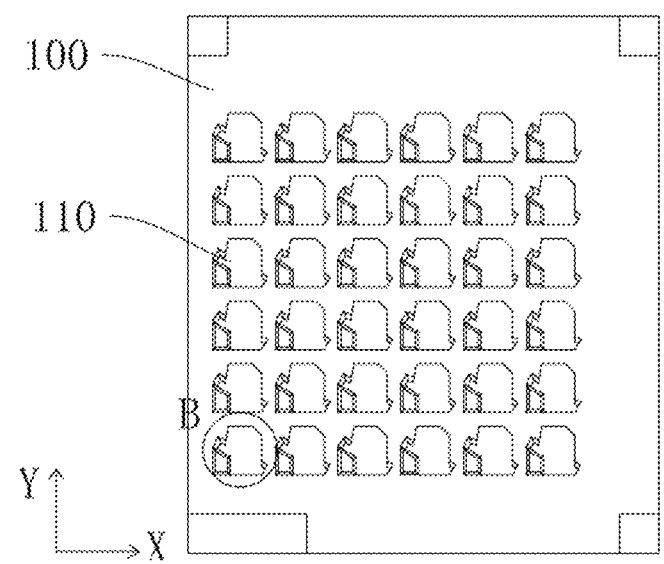
FIG. 2 is a top view of an insulating body of the electrical connector shown in FIG. 1.
Figure 3:
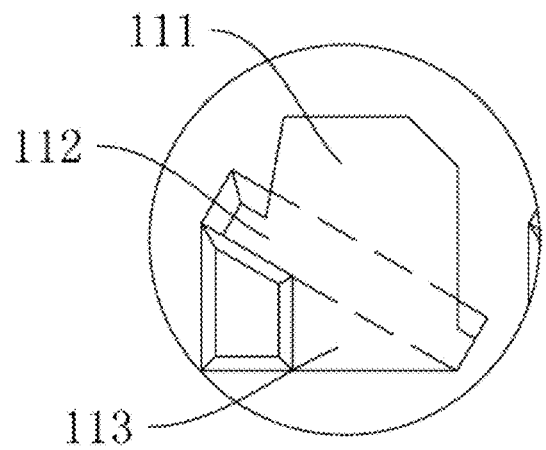
FIG. 3 is a partially enlarged view of a part B of the insulating body shown in FIG. 2.

Referring to FIG. 2 and FIG. 3, the receiving hole 110 includes a plurality of inner side faces, and includes a first hole portion 111, a second hole portion 112 and a third hole portion 113. The first hole portion 111 and the third hole portion 113 are both in communication with the second hole portion 112.

The second hole portion 112 is obliquely arranged relative to the first hole portion 111.

Figure 4:
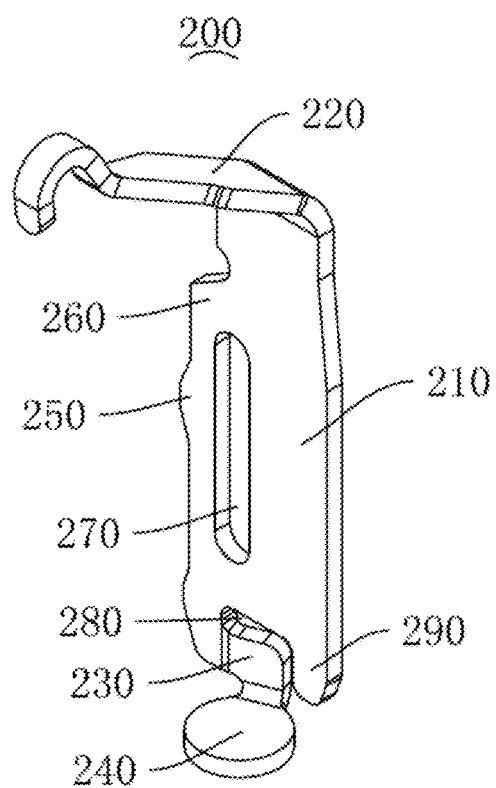
FIG. 4 is a schematic structural view of a conductive terminal of the electrical connector shown in FIG. 1.

Referring also to FIG. 4, each conductive terminal 200 includes a plate-shaped main body 210 that is vertically arranged, an elastic arm 220 extending from an upper end of the main body 210 and a connection portion 230 extending from a lower end of the main body 210. The elastic arm 220 has good elasticity and extends out of the insulating body 100. The connection portion 230 is connected to a welding portion 240. The welding portion 240 is bent at an angle of about 90 degrees relative to the main body 210, and welds the conductive terminal 200 to the printed circuit board via a welder.

The conductive terminal 200 further includes a holding portion 250 and a connection part 260 that are extending from a side of the main body 210. The connection part 260 is located above the holding portion 250. The holding portion 250 and the connection part 260 are located on the same side of the main body 210, and are both positioned in the same plane as the main body 210. Wherein, the connection part 260 is a remaining portion of a metal strap which connects the conductive terminal 200 with other conductive terminals before assembling the plurality of conductive terminals into the insulating body 100 and is cut off after the assembling.

An elastic groove 270 is arranged between the main body 210 and the holding portion 250. The elastic groove 270 has a closed structure, and at least one elastic groove 270 is used. The elastic groove 270 is compression resistant, and. when the conductive terminal 200 is mounted into the receiving hole 100 of the insulating body 100, the holding portion 250 is stressed to squeeze the elastic groove 270, so that the force apportioned on the main body 210 is less, the conductive terminal 200 is not easily deformed, thus reducing the defective rate of the conductive terminals 200 after the assembly.

The connection portion 230 and the main body 210 are not located in the same plane, and an acute angle is formed between the connection portion 230 and the main body 210. Specifically, the connection portion 230 extends from a lower end of the main body 210, one side of the connection portion 230 is connected to the main body 210, and the other side of the connection portion 230 is a free end. The free end of the connection portion 230 is outwardly inclined and separated from a lower end of the main body 210, and a specific spacing is defined between the connection portion 230 and the main body 210 in the horizontal direction.

In an embodiment, the acute angle formed between the connection portion 230 and the main body 210 is less than 30 degrees, such that the internal stress is uniform when the conductive terminal 200 receives an external force.

The lower part of the connection portion 230 is connected to the welding portion 240, the upper part of the connection portion 230 and the main body 210 form a spacer groove 280, and the elastic groove 270 is positioned above the spacer groove 280.

In some embodiments, in the main body 210, an extension portion 290 is arranged below the holding portion 250. The extension portion 290 is positioned on a side of the spacer groove 280. During the process of assembling the conductive terminal 200 into the insulating body 100, the extension portion 290 may balance the force applied onto the main body 210, such that the assembled conductive terminal 200 is more secure and more stable and the defective rate is lowered.

Figure 5:
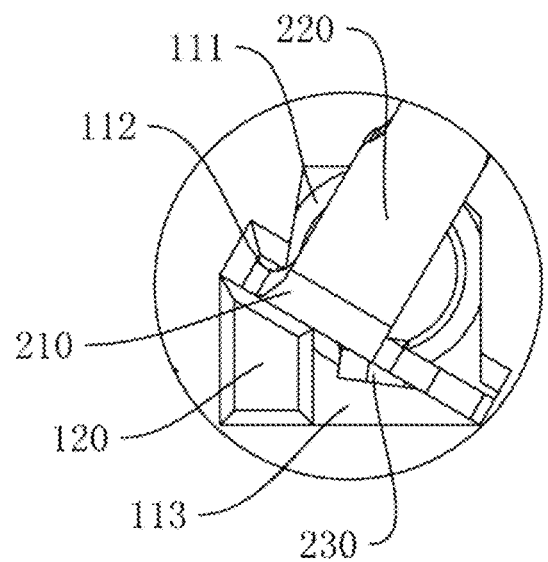
FIG. 5 is a partially enlarged view of a part A of the electrical connector shown in FIG. 1.

Referring to FIG. 5, the main body 210 and the elastic groove 270 are both received in the second hole portion 112, and the connection portion 230 is received in the third hole portion 113. The first hole portion 111 and the third hole portion 113 are respectively located on two opposite sides of the main body 210, and the elastic arm 220 is at least partially located above the first hole portion 111.

Exemplarily, if the direction in which the elastic arm 220 extends is the forward direction, the first hole portion 111 is positioned on the front side of the main body 210 and the third hole portion 113 is positioned on the rear side of the main body 210. The elastic arm 220 may be partially or totally located above the first hole portion 111.

The insulating body 100 further includes a support portion 120 located on the side of the main body 210 to support the main body 210. The support portion 120 and the third hole portion 113 are located on the same side of the main body 210.

In one embodiment, a contact surface between the support portion 120 and the main body 210 does not go beyond a central line between the left and right sides of the main body 210.

Figure 6:
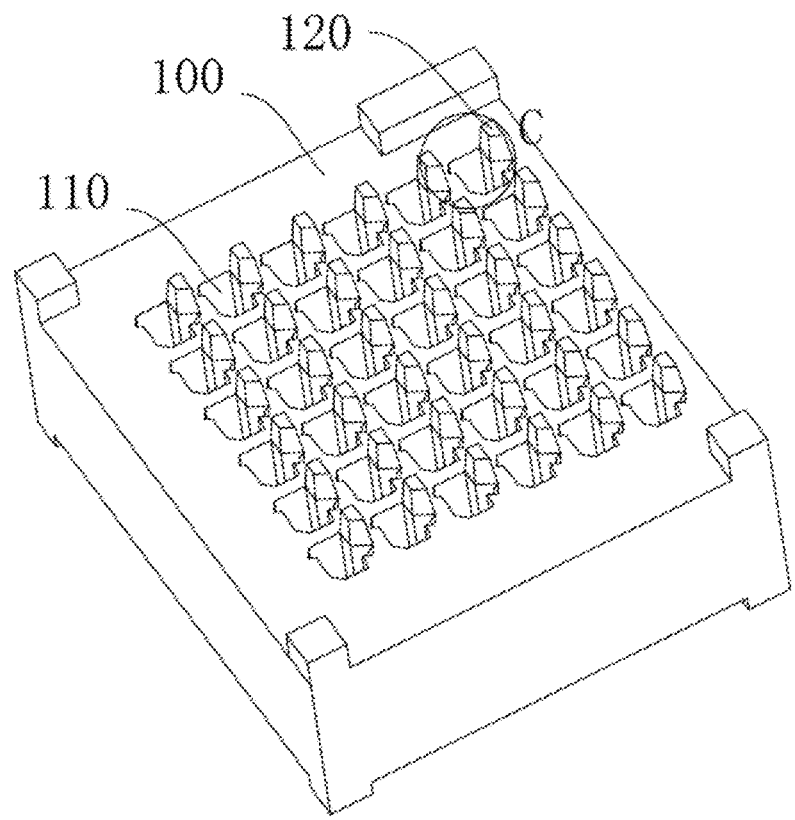
FIG. 6 is a schematic structural view of the insulating body shown in FIG. 2.
Figure 7:
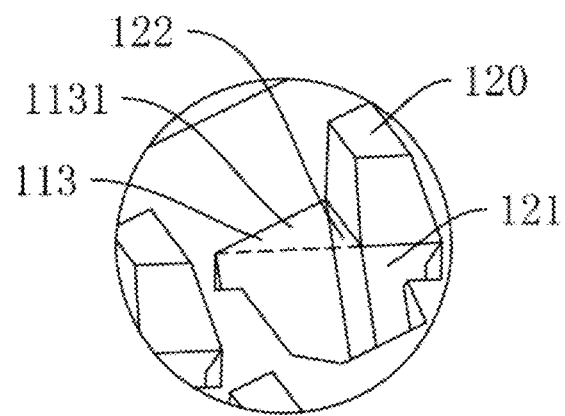
FIG. 7 is a partially enlarged view of a part C of the insulating body shown in FIG. 6.

Referring to FIG. 6 and FIG. 7, the support portion 120 includes a first side face 121 in communication with the second hole portion 112 and a second side face 122 in communication with the third hole portion 113. The first side face 121 is in contact with the main body 210, that is, a contact surface between the first side face 121 and the main body 210 does not go beyond the central line between the left and right sides of the main body 210. An extension surface of the first side face 121, the second side face 122 and an inner side face 1131 of the third hole portion 113 enclose to cooperatively define the third hole portion 113.

In some embodiments, the third hole portion 113 has a tri-cylinder shape.

Figure 8:
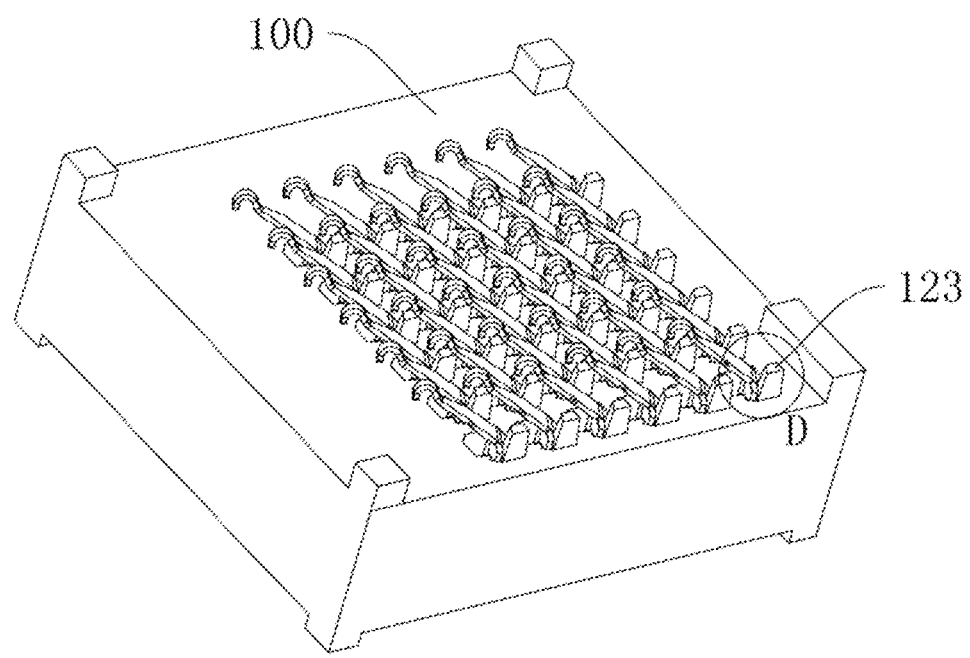
FIG. 8 is a schematic structural view of the electrical connector shown in FIG. 1.
Figure 9:
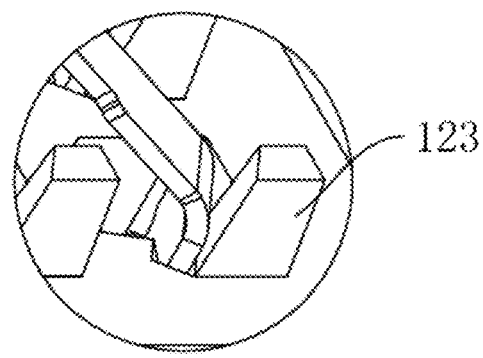
FIG. 9 is a partially enlarged view of a part D of the electrical connector shown in FIG. 8.

Referring to FIG. 8 and FIG. 9, the support portion 120 further includes a columnar portion 123 extending out of an upper surface of the insulating body 100. The columnar portion 123 has a cross section that is narrowed from bottom to top. During the process in which the electrical connector is contacting the chip module, the columnar portion 123 may support the chip module and prevent the chip module from being excessively pressing down.

In some embodiments, the columnar portion 123 has a trapezoidal columnar portion.

Figure 10:
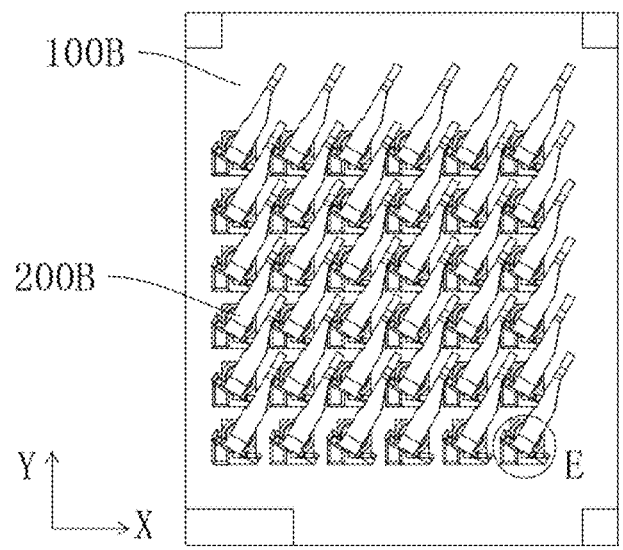
FIG. 10 is a top view of an electrical connector according to a second embodiment of the present disclosure.
Figure 11:
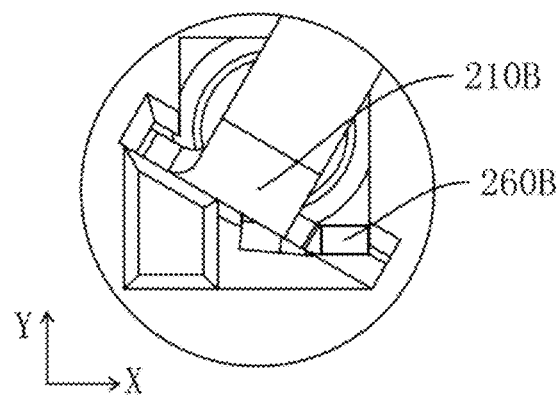
FIG. 11 is a partially enlarged view of a part E of the electrical connector shown in FIG. 10.

Referring to FIG. 10 and FIG. 11, a top view of an electrical connector according to a second embodiment of the present disclosure is shown. Different from the first embodiment, the electrical connector has a conductive terminal 200B, wherein a connection part 260B thereof and a main body 210B thereof are not positioned in the same plane. The connection part 260B is bent from a side of the main body 210B and extends along an X-axis or Y-axis direction of an insulating body 100B.

Figure 12:
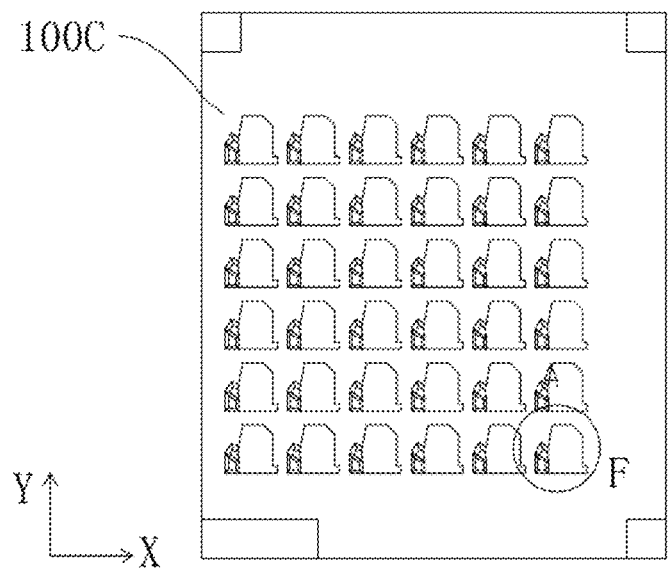
FIG. 12 is a top view of an insulating body of an electrical connector according to a third embodiment of the present disclosure.
Figure 13:
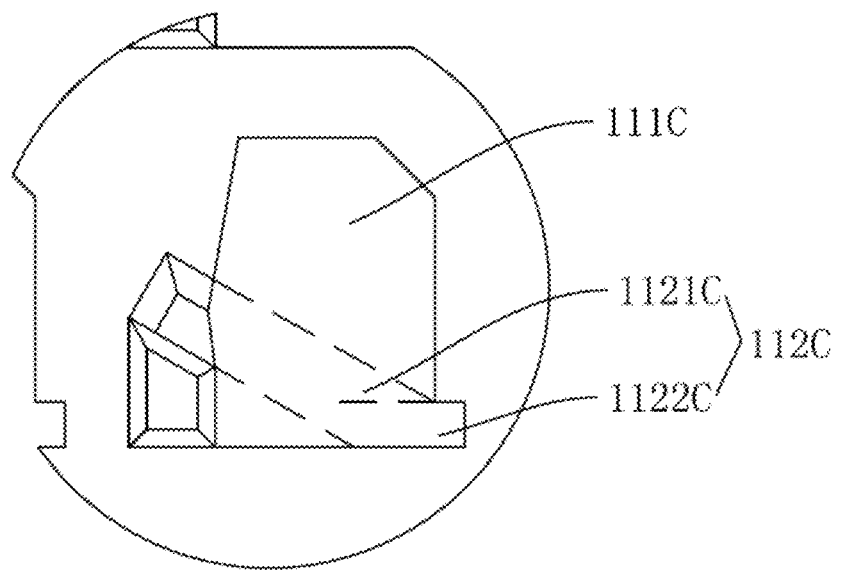
FIG. 13 is a partially enlarged view of a part F of the insulating body shown in FIG. 12.

Referring to FIG. 12 to FIG. 16, an electrical connector according to a third embodiment of the present disclosure is illustrated. As illustrated in FIG. 12 and FIG. 13, an insulating body 100C of the electrical connector is different from that disclosed in the first embodiment in that a second hole portion 112C includes a lateral hole portion 1121C which is obliquely arranged relative to a first hole portion 111C, and a horizontal hole portion 1122C which is arranged along an X-axis or Y-axis direction of the insulating body 100C. In this embodiment, the horizontal hole portion 1122C is arranged along the X-axis direction of the insulating body 100C.

Figure 14:
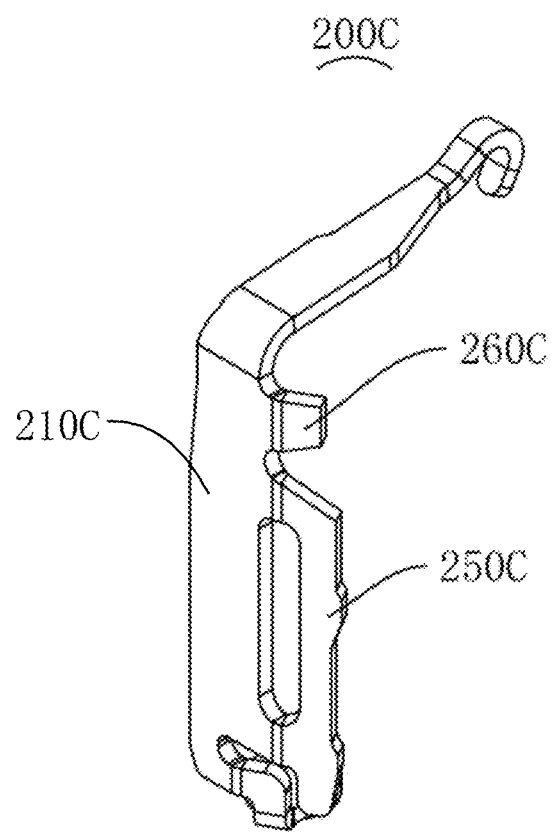
FIG. 14 is a top view of a conductive terminal of the electrical connector according to the third embodiment of the present disclosure.
Figure 15:
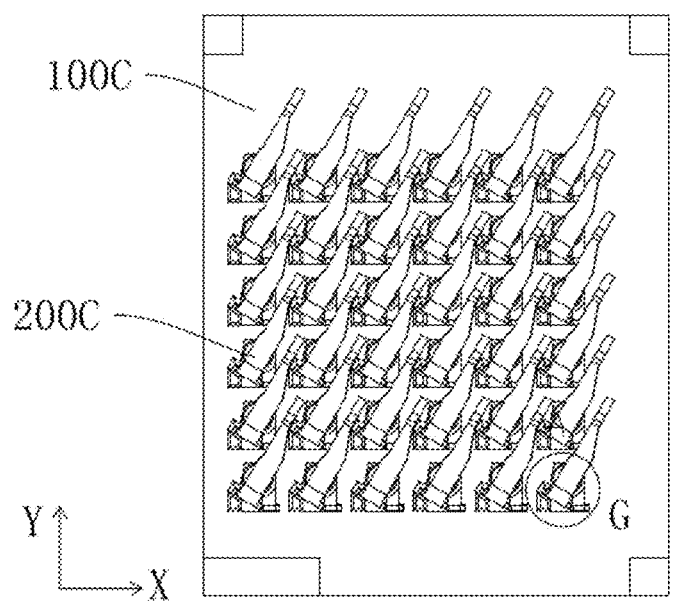
FIG. 15 is a top view of the electrical connector according to the third embodiment of the present disclosure.
Figure 16:
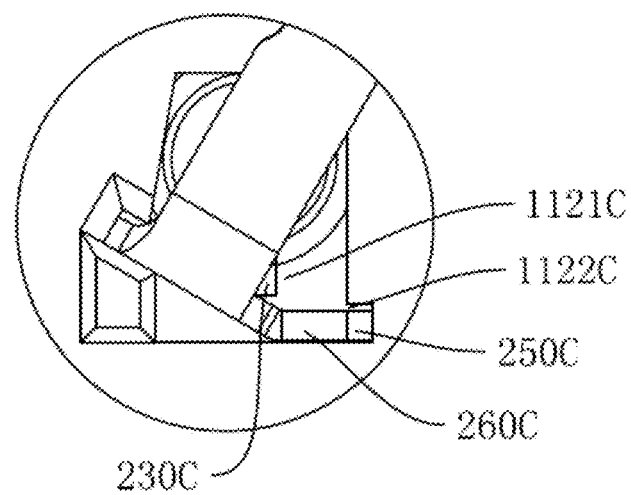
FIG. 16 is a partially enlarged view of a part G of the electrical connector shown in FIG. 15.

As illustrated in FIG. 14 to FIG. 16, a conductive terminal 200C of the electrical connector is different from that disclosed in the first embodiment in that a holding portion 250C thereof and a connection part 260C thereof are bent from a side of a main body 210C and extend along the X-axis or Y-axis direction of the insulating body 100C, the holding portion 250C and the connection part 260C are positioned in the same plane, and a free end of a connection portion 230C is inwardly inclined and separated from a lower end of the main body 210C.

Both of the holding portion 250C and the connection part 260C are received in the horizontal hole portion 1122C of the second hole portion 112C, and the connection portion 230C is received in the lateral hole portion 1121C.

Figure 17:
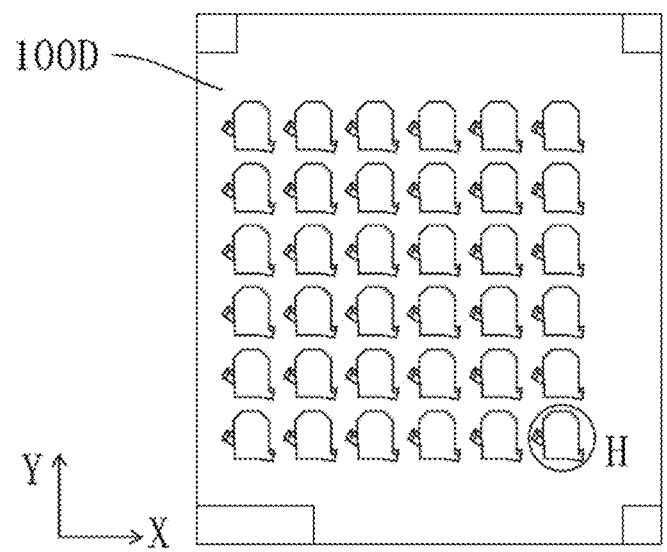
FIG. 17 is a top view of an insulating body of an electrical connector according to a fourth embodiment of the present disclosure.
Figure 18:
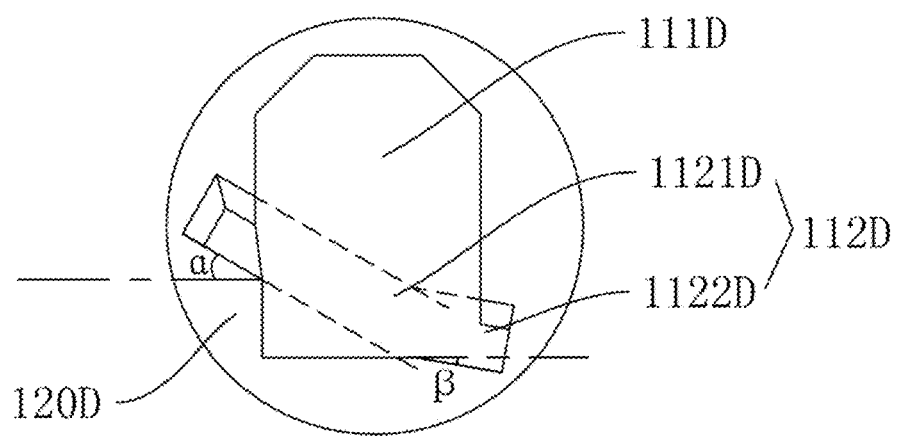
FIG. 18 is a partially enlarged view of a part H of the insulating body shown in FIG. 17.

Referring to FIG. 17 to FIG. 21, an electrical connection according to a fourth embodiment of the present disclosure is illustrated. As illustrated in FIG. 17 and FIG. 18, an insulating body 100D of the electrical connector is different from that disclosed in the first embodiment in that a second hole portion 112D includes a first lateral hole portion 1121D obliquely arranged relative to a first hole portion 111D, and a second lateral hole portion 1122D. An inclination angle α of the first lateral hole portion 1121D relative to an X axis of the insulating body 110D is greater than an inclination angle β of the second lateral hole portion 1122D relative to the X axis of the insulating body 100D.

In some embodiments, the inclination angle β of the second lateral hole portion 1122D relative to the X axis of the insulating body 100D is not greater than 10 degrees.

In this embodiment, a support portion 120D does not extend out of an upper surface of the insulating body 100D, and an upper surface of the support portion 120D may be aligned with the upper surface of the insulating body 100D. In other embodiments, the upper surface of the support portion 120D may also be lower than the upper surface of the insulating body 100D.

Figure 19:
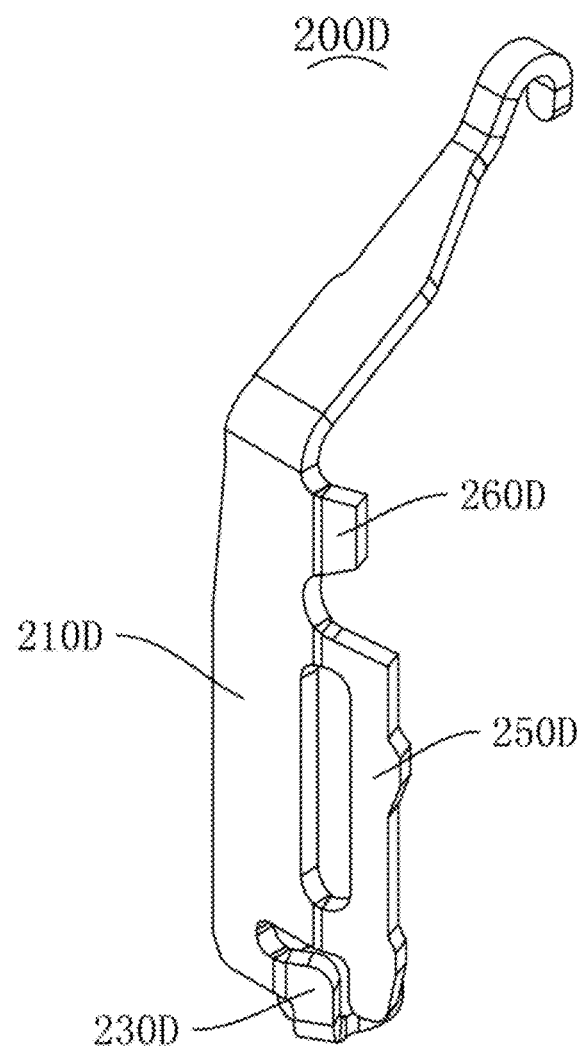
FIG. 19 is a top view of a conductive terminal of the electrical connector according to the fourth embodiment of the present disclosure.
Figure 20:
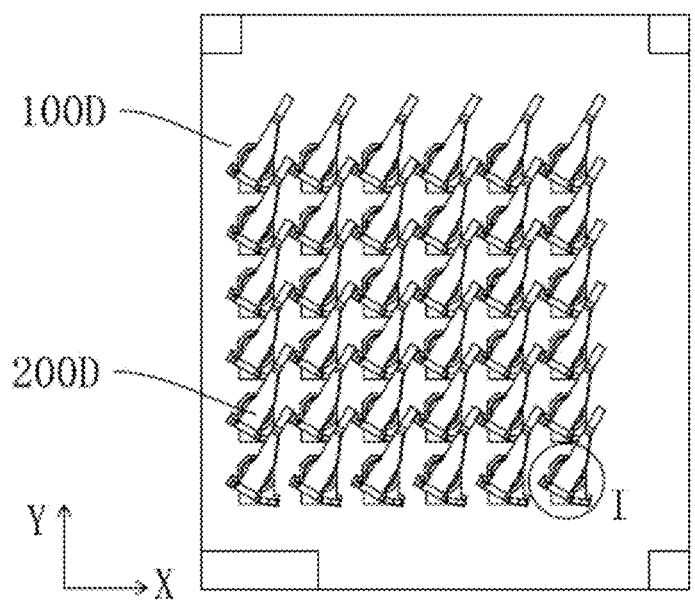
FIG. 20 is a top view of the electrical connector according to the fourth embodiment of the present disclosure.
Figure 21:
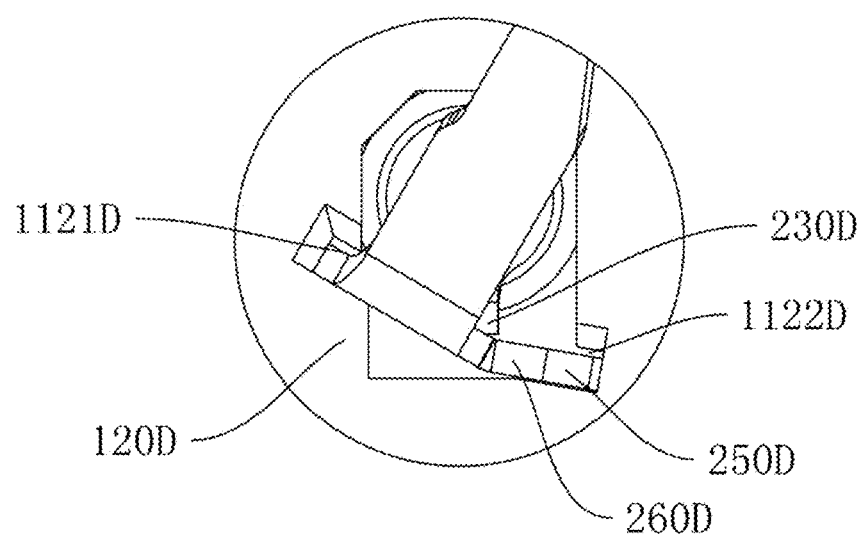
FIG. 21 is a partially enlarged view of a part I of the electrical connector in FIG. 20.

As illustrated in FIG. 19 to FIG. 21, a conductive terminal 200D of the electrical connector is different from that disclosed in the first embodiment in that a holding portion 250D thereof and a connection part 260D thereof are bent from and extend along a side of a main body 210D, the holding portion 250D and the connection part 260D are positioned in the same plane, and the connection portion 230D is inwardly inclined and separated from a lower end of the main body 210D.

Both of the holding portion 250D and the connection part 260D are received in the second lateral hole portion 1122D of the second hole portion 112D, and the connection portion 230D is received in the first lateral hole portion 1121D.

The electrical connector according to the first to fourth embodiments of the present disclosure includes an insulating body and a plurality of conductive terminals received in the insulating body. Each receiving hole in the insulating body has a plurality of inner side faces, and includes a first hole portion, a second hole portion and a third hole portion. Both of the first hole portion and the third hole portion are in communication with the second hole portion. The main body of the conductive terminal is received in the second hole portion, the first hole portion and the third hole portion are respectively located on two opposite sides of the main body, and the elastic arm is at least partially positioned above the first hole portion. The insulating body includes a support portion positioned on a side of the main body to support the main body, and the support portion and the third hole portion are positioned on the same side of the main body. In this way, the conductive terminal may be stably secured in the insulating body to prevent the conductive terminal from being shifting around in case of receiving any force.

Referring to FIG. 22 to FIG. 27, an electrical connector according to a fifth embodiment of the present disclosure is illustrated.

Figure 22:
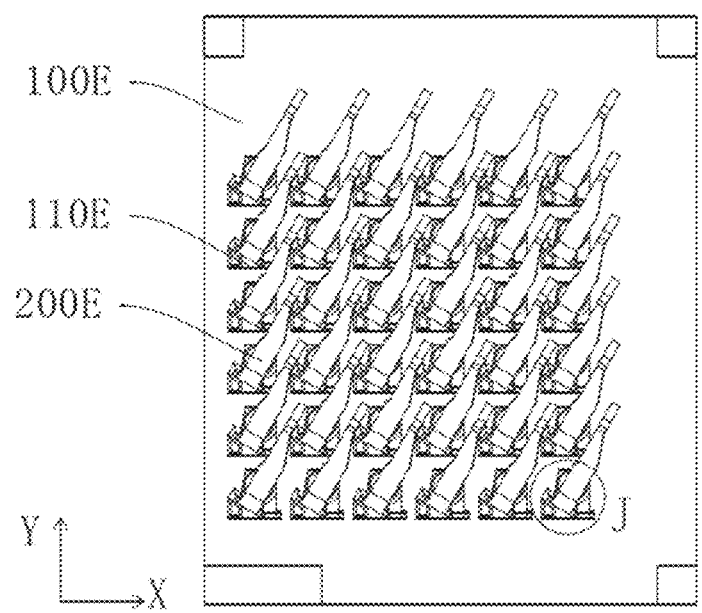
FIG. 22 is a top view of an electrical connector according to a fifth embodiment of the present disclosure.

As illustrated in FIG. 22, the electrical connector includes an insulating body 100E and a plurality of conductive terminals 200E received in the insulating body 100E. The insulating body 100E includes a plurality of securing holes 110E. The securing holes 110E are arranged in the form of grid in the insulating body 100E. In this embodiment, the securing holes 110E are parallelly arranged along an X axis or Y axis of the insulating body 100E, and one securing hole 110E receives one conductive terminal 200E.

Figure 23:
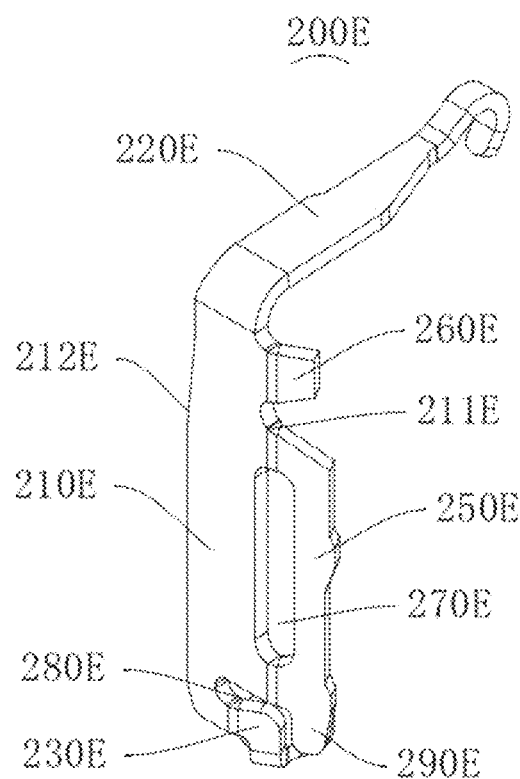
FIG. 23 is a schematic structural view of a conductive terminal of the electrical connector shown in FIG. 22.
Figure 24:
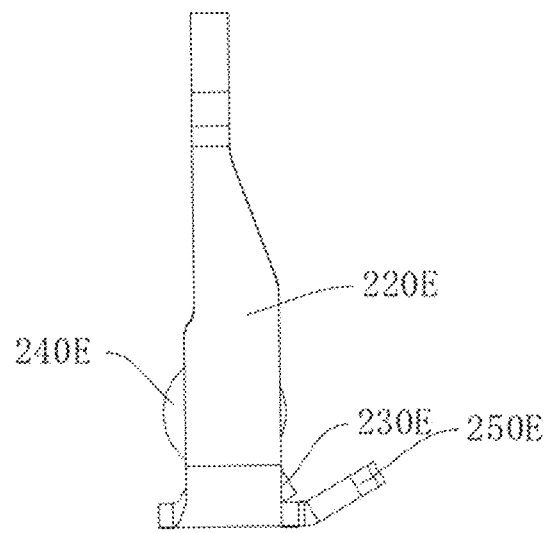
FIG. 24 is a top view of the conductive terminal shown in FIG. 23.

Referring to FIG. 23 and FIG. 24, each conductive terminal 200E includes a plate-shaped main body 210E that is vertically arranged, an elastic arm 220E extending from an upper end of the main body 210E and a connection portion 230E extending from a lower end of the main body 210E. The elastic arm 220E has good elasticity and extends out of the insulating body 100E. The connection portion 230E is connected to a welding portion 240E. The welding portion 240E is bent at an angle of about 90 degrees relative to the main body 210E, and welds the conductive terminal 200E to the printed circuit board via a welder.

The main body 210E includes a first side 211E and a second side 212E in the vertical direction. Using FIG. 24 as an example, the first side 211E is forwardly bent and extends to define a holding portion 250E.

In some embodiments, the conductive terminal 200E further includes a connection part 260E which is extending from the first side 211E of the main body 210E and positioned above the holding portion 250E. The holding portion 250E and the connection part 260E are positioned on the same side of the main body 210E, and the holding portion 250E and the connection part 260E are positioned in the same plane. Wherein, the connection part 260E is a remaining portion of a metal strap which connects the conductive terminal 200E with other conductive terminals before assembling the plurality of conductive terminals into the insulating body 100E and is cut off after the assembling.

A deformation groove 270E is arranged between the main body 210E and the holding portion 250E. The deformation groove 270E has a closed structure, and at least one deformation groove 270E is used. The deformation groove 270E is compression resistant, and. when the conductive terminal 200E is mounted into the receiving hole 100E of the insulating body 100, the holding portion 250E is stressed to squeeze the deformation groove 270E, so that the force apportioned on the main body 210E is less, the conductive terminal 200E is not easily deformed, thus reducing the defective rate of the conductive terminals 200E after the assembly.

The connection portion 230E and the main body 210E are not located in the same plane, and an acute angle is formed between the connection portion 230E and the main body 210E. In practice, the connection portion 230E extends from a lower end of the main body 210E, one side of the connection portion 230E is connected to the main body 210E, and the other side of the connection portion 230E is a free end. The free end of the connection portion 230E is inwardly inclined and separated from a lower end of the main body 210E, and a specific spacing is defined between the connection portion 230E and the main body 210E in the horizontal direction.

In an embodiment, the acute angle formed between the connection portion 230E and the main body 210E is less than 30 degrees, such that the internal stress is uniform when the conductive terminal 200E receives an external force.

The lower part of the connection portion 230E is connected to the welding portion 240E, the upper part of the connection portion 230E and the main body 210E form a spacer groove 280E, and the deformation groove 270E is positioned above the spacer groove 280E.

In some embodiments, in the main body 210E, an extension portion 290E is arranged below the holding portion 250E. The extension portion 290E is positioned on a side of the spacer groove 280E. During the process of assembling the conductive terminal 200E into the insulating body 100E, the extension portion 290E may balance the force applied onto the main body 210E, such that the assembled conductive terminal 200E is more secure and more stable and the defectiv rate is lowered.

Figure 25:
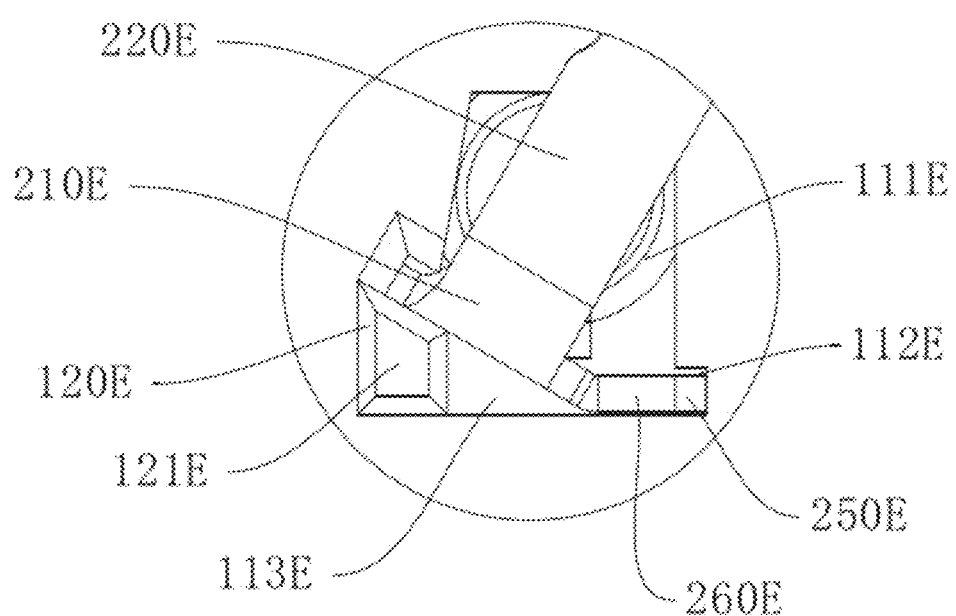
FIG. 25 is a partially enlarged view of a part J of the electrical connector shown in FIG. 22.

As illustrated in FIG. 25, the conductive terminal 200E is received in the securing hole 110E, the main body 210E is obliquely arranged relative to the X axis of the insulating body 100E, and both of the holding portion 250E and the connection part 260E are parallel to the X axis or Y axis of the insulating body. When the chip module is electrically connected to the conductive terminal 200E of the electrical connector by virtue of press, the elastic arm 220E of the conductive terminal 200E receives a force. In this way, a specific angle is formed between the main body 210E and the holding portion 250E, which prevents the conductive terminal 200E from shifting around.

Figure 26:
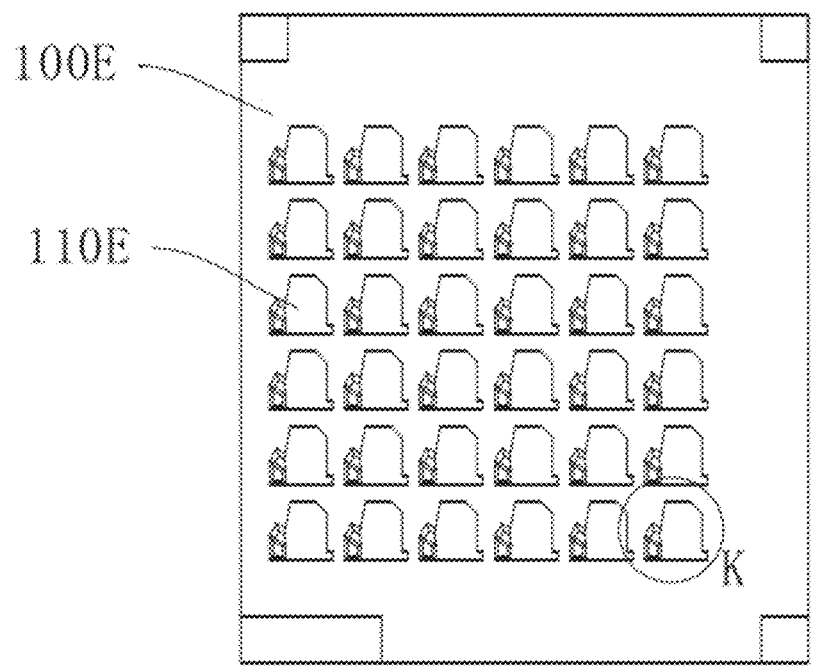
FIG. 26 is a top view of an insulating body of the electrical connector shown in FIG. 22.
Figure 27:
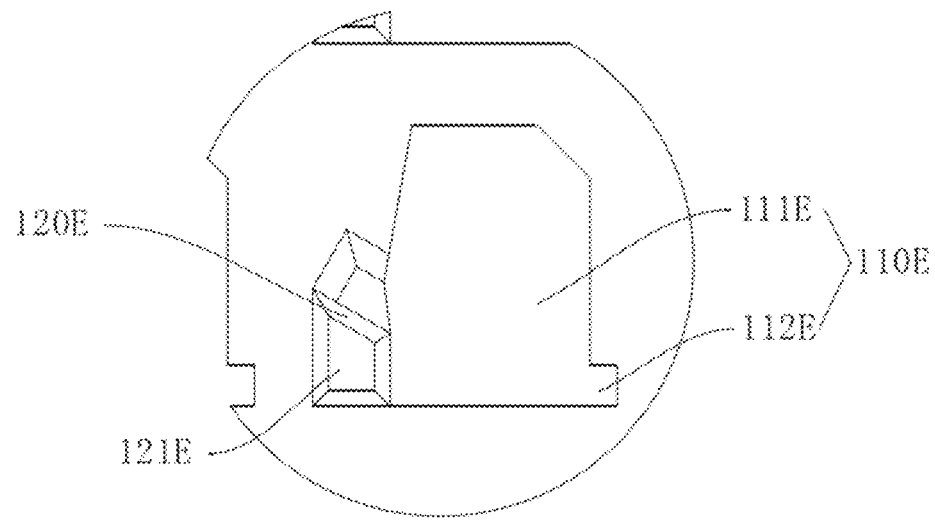
FIG. 27 is a partially enlarged view of a part K of the insulating body shown in FIG. 26.

Further referring to FIG. 26 and FIG. 27, the securing hole 110E includes a first securing hole portion 111E receiving the main body 210E and a second securing hole portion 112E at least partially receiving the holding portion 250E. The second securing hole portion 112E is parallel to the X axis or Y axis of the insulating body 100E, and the elastic arm 220E is at least partially positioned above the first securing hole portion 111E.

In one embodiment, the second securing hole portion 112E has a width that is less than a width of the holding portion 250E, and the holding portion 250E is partially received in the first securing hole portion 111E.

The insulating body 100E includes a support portion 120E located on a side of the main body 210E to support the main body 210E. Exemplarily, if the direction in which the elastic arm 220E extends is used as the forward direction, the support part 120E is located on a rear side of the main body 210E.

The support portion 120E includes a first side face supporting the main body 210E and a second side face not supporting the main body 210E. The first side face is a contact surface between the support portion 120E and the main body 210E, and the second side face, a portion of the main body 210E and inner side faces of the securing holes 110E enclose to cooperatively define a tri-cylinder space 113E. In some embodiments, the first side face does not go beyond a central line of the left and right sides of the main body 210E.

The support portion 120E further includes a columnar portion 121E formed by extension out of an upper surface of the insulating body 100E, wherein the columnar portion 121E has a cross section that is gradually narrowed from bottom to top. During the process in which electrical connector is contacting the chip module, the columnar portion 123E may support the chip module and prevent the chip module from being excessively pressing down.

In some embodiments, the columnar portion 121E has a trapezoidal columnar portion.

Referring to FIG. 28 to FIG. 33, an electrical connector according to a sixth embodiment of the present disclosure is illustrated.

Figure 28:
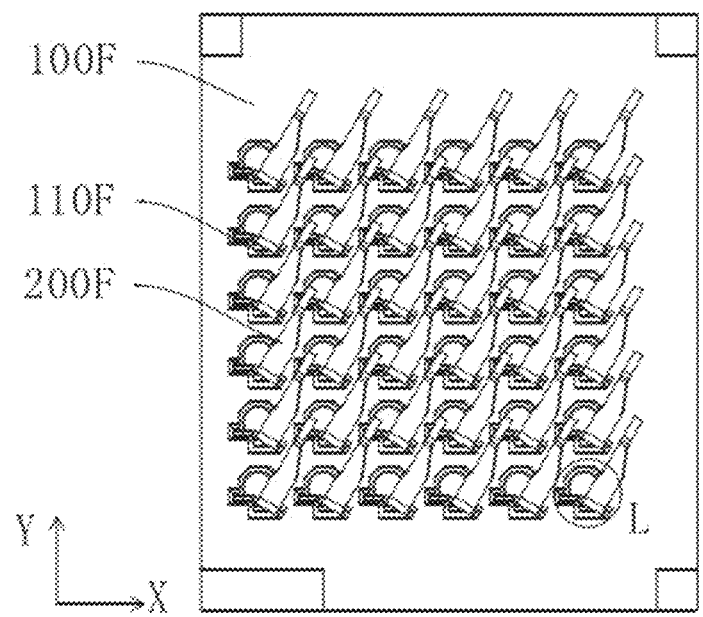
FIG. 28 is a top view of an electrical connector according to a sixth embodiment of the present disclosure.

As illustrated in FIG. 28, the electrical connector includes an insulating body 100F and a plurality of conductive terminals 200F received in the insulating body 100F. The insulating body 100F includes a plurality of securing holes 110F. The plurality of securing holes 110F are parallelly arranged along an X axis or Y axis of the insulating body 100F, and one securing hole 110F receives one conductive terminal 200F.

Figure 29:
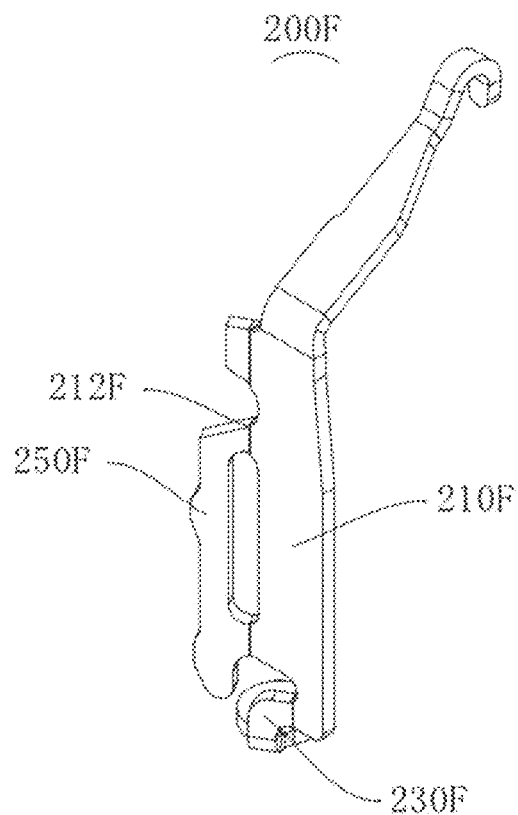
FIG. 29 is a schematic structural view of a conductive terminal of the electrical connector shown in FIG. 28.
Figure 30:
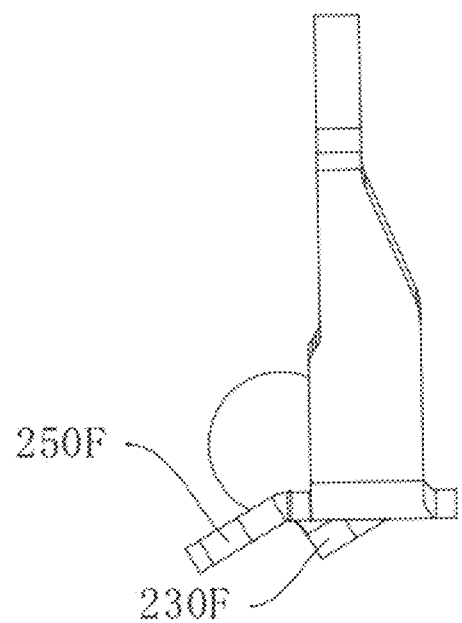
FIG. 30 is a top view of the conductive terminal shown in FIG. 29.

Referring to FIG. 29, and FIG. 30, the conductive terminal 200F is different from that disclosed in the fifth embodiment in that, using FIG. 30 as an example, a holding portion 250F is obliquely bent and extends from a second side 212F of the main body 210F, and a free end of a connection portion 230F is outwardly inclined and separated from a lower end of the main body 210F.

Figure 31:
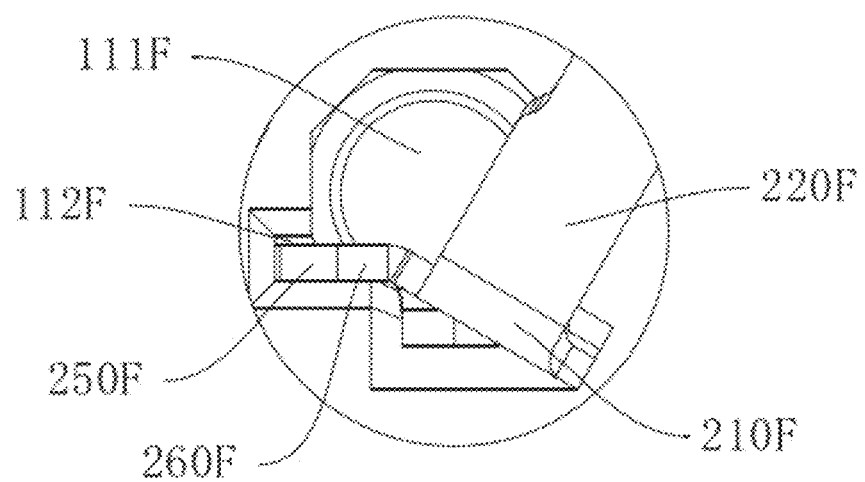
FIG. 31 is a partially enlarged view of a part L of the electrical connector shown in FIG. 28.

As illustrated in FIG. 31, the conductive terminal 200F is received in the securing hole 110F, and likewise, the main body 210F is obliquely arranged relative to an X axis of the insulating body 100F, and both of the holding portion 250F and a connection part 260F are parallel to the X axis or Y axis of the insulating body 100F.

Figure 32:
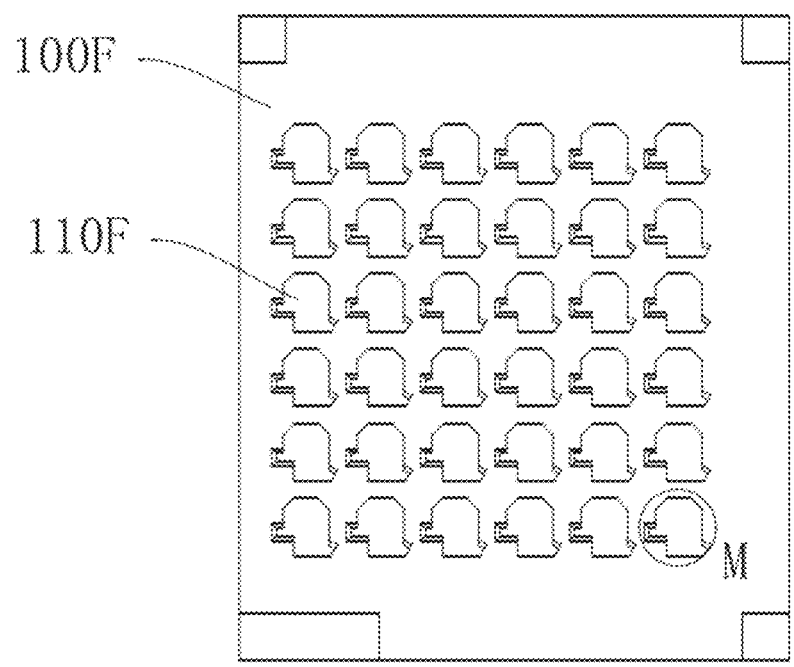
FIG. 32 is a top view of an insulating body of the electrical connector shown in FIG. 28.
Figure 33:
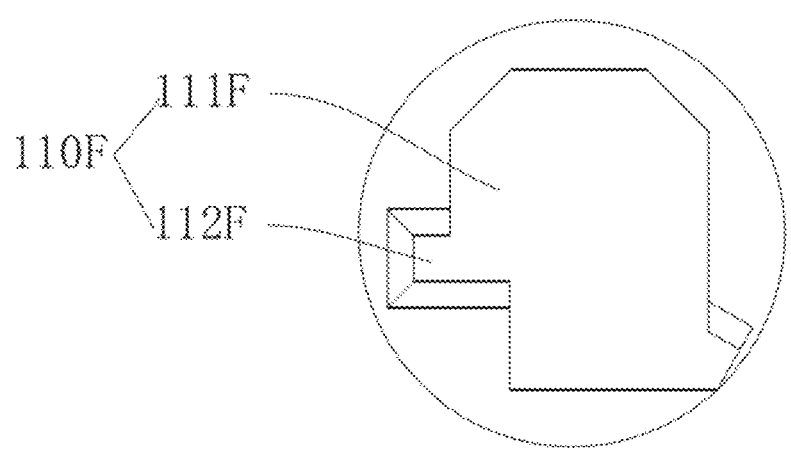
FIG. 33 is a partially enlarged view of a part M of the insulating body shown in FIG. 32.

Further referring to FIG. 32 and FIG. 33, the securing hole 110F includes a first securing hole portion 111F receiving the main body 210E and a second securing hole portion 112F at least partially receiving the holding portion 250F. The second securing hole portion 112F is parallel to the X axis or Y axis of the insulating body 100F, and the elastic arm 220F is partially positioned above the first securing hole portion 111F and partially positioned above an outer side region of the first securing hole portion 111F.

In one embodiment, the second securing hole portion 112F has a width that is less than a width of the holding portion 250F, and the holding portion 250F is partially received in the first securing hole portion 111F.

The electrical connector according to the fifth and sixth embodiments of the present disclosure includes an insulating body and a plurality of conductive terminals received in the insulating body. The conductive terminal includes a main body, an elastic arm obliquely extending from an upper end of the main body and a connection portion extending from a lower end of the main body. A holding portion extends from a side of the main body. The main body is obliquely arranged relative to an X axis of the insulating body, and the holding portion is parallel to the X axis or Y axis of the insulating body. In this way, the conductive terminal may be stably secured in the insulating body to prevent the conductive terminal from being shifting around in case of receiving any force.

It should be noted that the specification and drawings of the present disclosure illustrate preferred embodiments of the present disclosure. However, the present disclosure may be implemented in different manners, and is not limited to the embodiments described in the specification. The embodiments described are not intended to limit the present disclosure, but are directed to rendering a thorough and comprehensive understanding of the disclosure. In addition, the technical features described above may incorporate and combine with each other to derive various embodiments not illustrated in the above specification, and such derived embodiments shall all be deemed as falling within the scope of the disclosure contained in the specification of the present disclosure. Further, a person skilled in the art may make improvements or variations according to the above description, and such improvements or variations shall all fall within the protection scope as defined by the claims of the present disclosure.

What is claimed is:

1. An electrical connector, for electrically connecting a chip module to a printed circuit board, the electrical connector comprising: an insulating body and a plurality of conductive terminals received in the insulating body, the insulating body defining a plurality of receiving holes, each of the receiving holes receiving a respective one of the conductive terminals, each of the conductive terminals comprising a main body, an elastic arm, a connection portion and a welding portion, the elastic arm obliquely extending from an upper end of the main body, the connection portion extending from a lower end of the main body, the welding portion connected to the connection portion; wherein
    each of the receiving holes has a plurality of inner side faces, and comprises a first hole portion, a second hole portion and a third hole portion, the first hole portion and the third hole portion being both in communication with the second hole portion;
    the main body is received in the second hole portion, the first hole portion and the third hole portion are respectively positioned on two opposite sides of the main body, and the elastic arm is at least partially positioned above the first hole portion; and
    the insulating body comprises a support portion located on a side of the main body to support the main body, and the support portion and the third hole portion are located on the same side of the main body.

2. The electrical connector according to claim 1, wherein the second hole portion comprises a first lateral hole portion and a second lateral hole portion that are obliquely arranged relative to the first hole portion, an inclination angle of the first lateral hole portion relative to an X axis of the insulating body being greater than an inclination angle of the second lateral hole portion relative to the X axis of the insulating body; and
    the conductive terminal further comprises a holding portion being bent and extending from a side of the main body, the holding portion being received in the second lateral hole portion.

3. The electrical connector according to claim 1, wherein a contact surface between the support portion and the main body does not go beyond a central line between left and right sides of the main body.

4. The electrical connector according to claim 1, wherein the second hole portion is obliquely arranged relative to the first hole portion.

5. The electrical connector according to claim 4, wherein the conductive terminal further comprises a holding portion and a connection part that are extending from a side of the main body, the connection part being located above the holding portion; and
    the holding portion and the main body are positioned in the same plane, and the connection part is bent from the side of the main body and extends along an X-axis or Y-axis direction of the insulating body.

6. The electrical connector according to claim 1, wherein the second hole portion comprises a lateral hole portion and a horizontal hole portion, the lateral hole portion obliquely arranged relative to the first hole portion, and the horizontal hole portion arranged along an X-axis or Y-axis direction of the insulating body; and the conductive terminal further comprises a holding portion extending from a side of the main body, the holding portion being bend from the side of the main body and extending along the X-axis or Y-axis direction of the insulating body, and the holding portion being received in the horizontal hole portion.

7. The electrical connector according to claim 6, wherein the conductive terminal further comprises a connection part extending from a side of the main body and located above the holding portion, the connection part and the holding portion being positioned in the same plane.

8. The electrical connector according to claim 1, wherein the support portion comprises a first side face in communication with the second hole portion and a second side face in communication with the third hole portion, the first side face being in contact with the main body; and an extension surface of the first side face, the second side face and inner side faces of a receiving hole enclose to cooperatively define the third hole portion.

9. The electrical connector according to claim 8, wherein the third hole portion has a tri-cylinder shape.

10. The electrical connector according to claim 8, wherein the support portion further comprises a columnar portion formed by extension out of an upper surface of the insulating body, the columnar portion having a cross section that is gradually narrowed from bottom to top, and the columnar portion having a trapezoidal columnar portion.

11. An electrical connector, for electrically connecting a chip module to a printed circuit board, the electrical connector comprising: an insulating body and a plurality of conductive terminals received in the insulating body, the insulating body defining a plurality of securing holes, each of the securing holes receiving a respective one of the conductive terminals, each of the conductive terminals comprising a main body, an elastic arm, a connection portion and a holding portion, the elastic arm obliquely extending from an upper end of the main body, the connection portion extending from a lower end of the main body, the holding portion extending from a side of the main body; wherein the main body is obliquely arranged relative to an X axis of the insulating body, and the holding portion is parallel to the X axis or Y axis of the insulating body; and wherein, a closed deformation groove is arranged between the main body and the holding portion.

12. The electrical connector according to claim 11, wherein the connection portion and the main body are not located in the same plane, and an acute angle is formed between the connection portion and the main body.

13. The electrical connector according to claim 11, wherein the securing hole comprises a first securing hole portion and a second securing hole portion, the first securing hole portion receiving the main body, the second securing hole portion at least partially receiving the holding portion; and the second securing hole portion is parallel to the X axis or Y axis of the insulating body.

14. The electrical connector according to claim 13, wherein the conductive terminal further comprises a connection part extending from a side of the main body and located above the holding portion; and the connection part and the holding portion are located on the same side of the main body, and the connection part is parallel to the X axis or Y axis of the insulating body.

15. The electrical connector according to claim 14, wherein the second securing hole portion has a width less than a width of the holding portion, and the holding portion is partially received in the first securing hole portion.

16. The electrical connector according to claim 13, wherein the holding portion is obliquely bent forward and extends from a first side of the main body, or is obliquely bent backward and extending from a second side of the main body.

17. The electrical connector according to claim 16, wherein the elastic arm is at least partially positioned above the first securing hole portion.

18. The electrical connector according to claim 16, wherein the insulating body comprises a support portion located on a side of the main body to support the main body; and the support portion comprises a first side face and a second side face, the first side face supporting the main body, the second side face not supporting the main body, the second side face, a portion of the main body and inner side faces of the securing holes enclosing to cooperatively define a tri-cylinder space.

19. The electrical connector according to claim 18, wherein the support portion further comprises a columnar portion formed by extension out of an upper surface of the insulating body, the columnar portion having a cross section that is gradually narrowed from bottom to top.

* * * * *